United States Patent
D'Couto et al.

(10) Patent No.: US 6,673,716 B1
(45) Date of Patent: Jan. 6, 2004

(54) CONTROL OF THE DEPOSITION TEMPERATURE TO REDUCE THE VIA AND CONTACT RESISTANCE OF TI AND TIN DEPOSITED USING IONIZED PVD TECHNIQUES

(75) Inventors: Gerard C. D'Couto, San Jose, CA (US); George Tkach, Santa Clara, CA (US); Michael Woitge, Dresden (DE); Michal Danek, Cupertino, CA (US)

(73) Assignee: Novellus Systems, Inc., San Jose, CA (US)

( * ) Notice: Subject to any disclaimer, the term of this patent is extended or adjusted under 35 U.S.C. 154(b) by 6 days.

(21) Appl. No.: 10/060,725

(22) Filed: Jan. 30, 2002

Related U.S. Application Data
(60) Provisional application No. 60/265,427, filed on Jan. 30, 2001.

(51) Int. Cl.[7] .............................................. H01L 21/22
(52) U.S. Cl. .................. 438/656; 438/625; 438/643; 438/694; 438/648; 438/679; 204/192.12; 204/298.09; 204/298.12
(58) Field of Search .............................. 438/622, 625, 438/627, 628, 629, 642, 643, 644, 648, 652–654, 656, 679, 685; 204/192.1, 192.11, 192.12, 192.17, 192.15, 192.22, 192.38, 298.01, 298.02, 298.04, 298.09, 298.12, 298.13, 298.15, 298.16, 298.17, 298.18, 298.21

(56) References Cited

U.S. PATENT DOCUMENTS

| | | | |
|---|---|---|---|
| 6,028,003 A | 2/2000 | Frisa et al. | |
| 6,080,285 A | 6/2000 | Liu et al. | |
| 6,176,931 B1 | 1/2001 | Restaino et al. | |
| 6,238,532 B1 | 5/2001 | Rossnagel et al. | |
| 6,251,242 B1 * | 6/2001 | Fu et al. ................. | 204/298.19 |
| 6,342,133 B2 * | 1/2002 | D'Couto et al. ........ | 204/192.17 |

OTHER PUBLICATIONS

Higushi et al, "Optical emission spectroscopy from arc–like Ti vapor plasma and effects of self–ion bombardment on Ti and TiN film deposition", J. Vac. Sci. Tenchnol. A 14(6), 1996, pp 3147–3155.*

* cited by examiner

*Primary Examiner*—Carl Whitehead, Jr.
*Assistant Examiner*—Thanhha Pham
(74) *Attorney, Agent, or Firm*—DeLio & Peterson, LLC; Kelly M. Reynolds

(57) ABSTRACT

A method of depositing thin films comprising Ti and TiN within vias and trenches having high aspect ratio openings. The Ti and TiN layers are formed on an integrated circuit substrate using a Ti target in a non-nitrided mode in a hollow cathode magnetron apparatus in combination with controlling the deposition temperatures by integrating cooling steps into the Ti/TiN deposition processes to modulate the via and contact resistance. The Ti and TiN layers are deposited within a single deposition chamber, without the use of a collimator or a shutter.

18 Claims, 5 Drawing Sheets

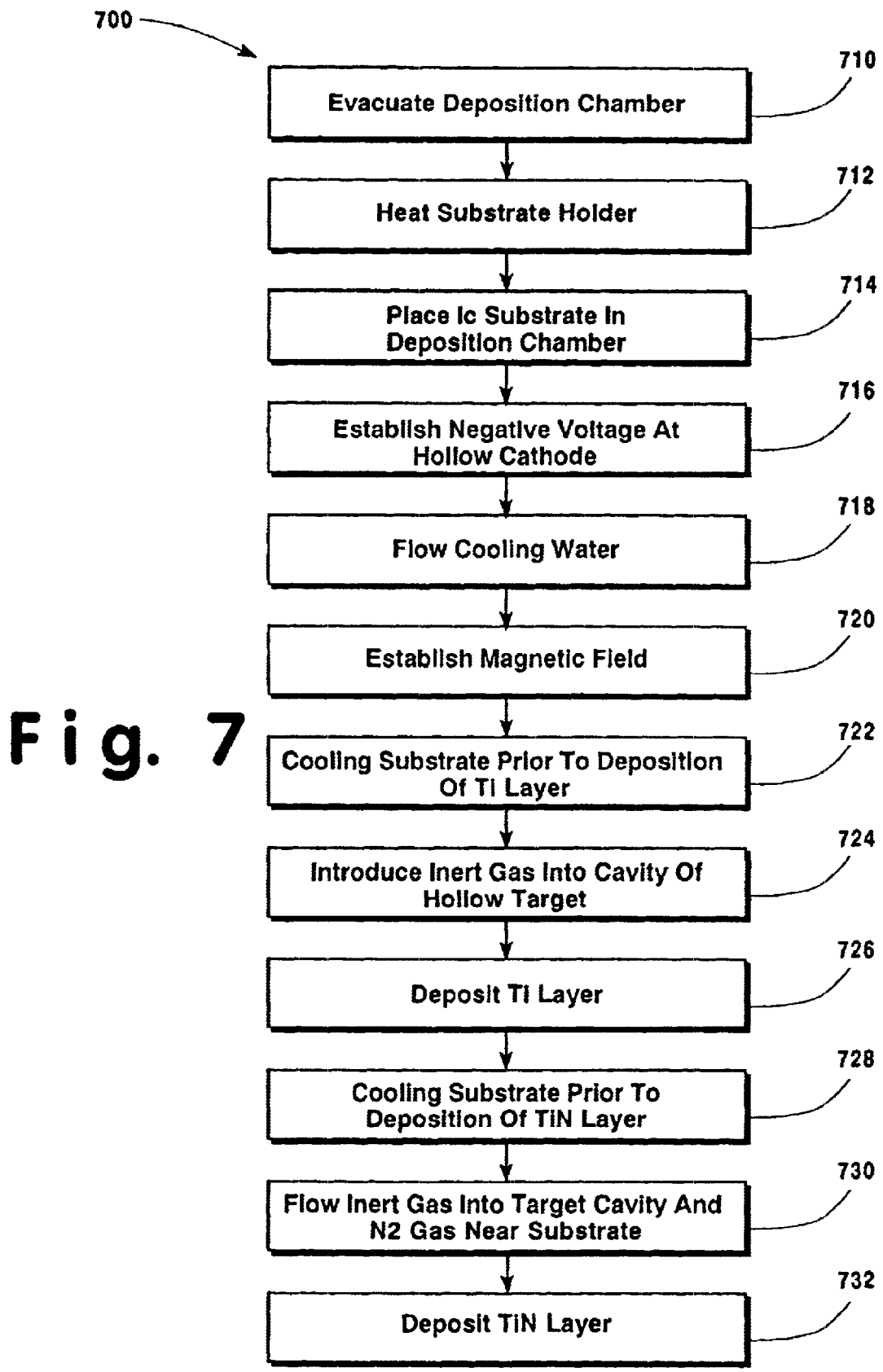

CONTROL OF THE DEPOSITION TEMPERATURE TO REDUCE THE VIA AND CONTACT RESISTANCE OF TI AND TIN DEPOSITED USING IONIZED PVD TECHNIQUES

PRIORITY

This application claims the benefit of U.S. Provisional Application No. 60/265,427 filed on Jan. 30, 2001.

RELATED APPLICATIONS

This application is related to U.S. patent application Ser. No. 10/060,724 (Attorney Docket No. NOVE100028000), filed the same day and assigned to the same assignee as the present application, the disclosure of which is incorporated herein by reference.

BACKGROUND OF THE INVENTION

1. Field of the Invention

The present invention relates to a method for depositing titanium (Ti) liner layers and titanium nitride (TiN) barrier layers for applications in semiconductor processing having improved via and contact resistance.

2. Description of Related Art

In the manufacture of semiconductor devices, metal conductive layers are patterned for the purpose of making interconnections between different points on the device. After formation of this patterned metal conductive layer an electrically insulative material is deposited over the metal conductive layer. Vias may then be etched in the insulative layer in positions where contacts are desired between conductive regions. A robust diffusion barrier, or liner, may then be deposited into the via between the underlying metal and a metal layer deposited therein, such as by chemical vapor deposition of tungsten (W), for the formation of a stud. The robust diffusion barrier both prevents attack of the underlying metal and acts as an adhesion layer for stud.

In modern integrated circuit ("IC") technology, a metallization comprising a Ti layer, a TiN layer and a top conductive layer is often provided on a surface of a semiconductor body. The Ti layer serves to obtain good adhesion and low contact resistance between the metallization and the semiconductor body. Typically, the TiN layer serves as a barrier between a top conductive layer of Al and the underlying Ti layer, thereby preventing chemical reactions therebetween. That is, the Ti layer reduces any oxide left on the underlying Al layer after a sputter preclean step, thus allowing for low contact resistance. Alternatively, the TiN layer may serve as a barrier between the Ti layer and a top conductive layer of W deposited using $WF_6$, thereby preventing chemical reactions between Ti and F which is formed during such a CVD process. Additionally, the TiN layer is needed to improve the adhesion of the CVD W for a following CMP removal step. An anti-reflective coating ("ARC") of TiN can also be deposited on the surface of the W or Al. Thus, a typical stack arrangement on an IC semiconductor substrate may include a Ti contact layer on the semiconductor surface, a TiN barrier layer, a W or Al interconnect layer, and a TiN ARC layer for the purpose of reducing optical reflection.

These films are generally deposited by physical vapor deposition (PVD), also known as sputtering. Various physical vapor deposition ("PVD") sputtering techniques known in the art for depositing TiN/Ti stacks may be categorized as either nitrided mode ("NM"), i.e., poisoned mode, or non-nitrided mode ("NNM"), i.e., metallic mode. In the NM (nitrided mode), typically a titanium target is placed in a sputter chamber, and the TiN layers are deposited by sputtering titanium with a sputter gas, such as argon ("Ar"), in the presence of nitrogen. In a NM technique, the titanium target is inundated with nitrogen atoms, becoming "nitrided", such that a coating of TiN forms on the surface of the titanium target. This decreases the overall deposition rate of the desired layer of TiN onto the IC substrate because the nitrogen in the titanium target interferes with the sputtering of titanium. A disadvantage is that the titanium target used to deposit TiN cannot then be used to deposit Ti. As a result, various separate deposition chamber techniques have been introduced in the art for depositing each of the Ti and TiN layers.

It is also known in the art to deposit the Ti/TiN stacks in the non-nitrided mode ("NNM"), i.e., metallic mode. Deposition of TiN in the NNM keeps the $N_2$ away from the target, hence, the target being non-nitrided or the target being in a metallic mode. In the NNM, the depositions of the Ti and TiN layers may be performed in the same deposition chamber, allowing for a higher throughput for the PVD system and allowing redundancy to be built into the system. It has been found that TiN deposited in the NNM mode tends to be a poor barrier by itself, often requiring having to anneal the NNM TiN deposited layer, such as by Rapid Thermal Nitridation or Rapid Thermal Anneal, to improve the TiN barrier properties. In so doing, the annealing step improves the barrier properties by causing growth at the grain boundary of the TiN, thereby reducing the diffusion of WF6 gas used for the CVD deposition of a W layer thereover, and hence improving the barrier properties. The nitridation or anneal step also influences the nucleation (initial growth steps) of the CVD W and plays an influential role in the final film properties of the CVD W film that is grown on the TiN barrier film. However, having to anneal the NNM TiN deposited layer requires additional processing steps and, as such, increases both time and processing expenses.

It is also known in the art to use a shutter that allows deposition of Ti and TiN in the same deposition chamber. A Ti layer is first deposited using a Ti target. Then, a TiN layer is deposited on the Ti layer using the same Ti target in a NM. During TiN deposition in the NM, the Ti target becomes nitrided, i.e., poisoned. Before depositing the Ti layer on the next wafer, the shutter is inserted between the target and the wafer, and the target is sputtered in the absence of nitrogen gas to sputter away the nitrided components to return the target to its clean, metallic state and ready for the sputtering of pure Ti. To reduce the inefficiency of using a shutter or separate chambers for Ti and TiN deposition, modifications in the sputtering sequence have been suggested in the prior art, such as, the deposition of an extra Ti layer to sputter away the nitrogen in the nitrided titanium target, returning it to a pure Ti state, thereby reducing the number of chambers being used. However, the use of an extra titanium layer has the disadvantage that if a CVD W layer is deposited on the extra Ti layer using $WF_6$, any free Ti reacts with F to form a layer of $TiF_5$, to which W has a bad adhesion. Accordingly, the use of a shutter in the deposition processes of Ti and TiN layers also requires additional processing steps, increases processing time, and increases processing costs.

As the aspect ratio ("AR") of the via increases, i.e., the ratio of the height of the aperture to its width, it has been found that conventional sputtering techniques do not provide acceptable deposition results. As the AR increases, far less material is being deposited at the bottom of the vias than at the top surfaces of the vias, since the sidewalls "shadow" the lower exposed surface. The deposited material at the upper surfaces increasingly accentuates the shadowing effect, thereby prematurely closing the upper section of the via and preventing effective fill of the lower section. For example, with a conventional sputter method, bottom coverage is only about 5% in a via having an AR of 5:1. In order to improve the deposition of Ti and TiN into vias having increased AR, collimation sputtering techniques have been developed in the art.

Collimation techniques having a collimating filter, as known in the art, between the target and the substrate impart greater directionality to the atoms reaching the substrate surface. The use of a collimator allows deposition of Ti and TiN in vias with aspect ratios up to about 2 or 3. However, collimation techniques are inefficient as much of the target material is wasted and builds up on the cell walls of the filter which can lead to an undesired increase in the number of particulates in the system, making it necessary to replace or clean the collimator frequently. Also, since most of the sputtered material does not pass through the collimator and is wasted, the deposition rate is slow and the rate of consumption of the target is high. To overcome such problems, prior art has been aimed at increasing the sputter power in the NM to obtain a practical growth rate, however, when increasing the sputter power it is also necessary to increase the flow rate of nitrogen. This causes the growth rate of the TiN film to be reduced to less than one-third under the same sputter power as compared with the case in which Ti film is formed by such sputtering process.

A collimator can also be used in a NNM process in which $N_2$ gas enters the deposition chamber towards the wafer substrate and is prevented from passing through the collimator towards the target by the flow of Ti atoms. In such a process, it is necessary to exactly balance and control the sputter power and the flow rates of inert Ar and $N_2$ gases, however, such control is difficult and the Ti targets often become nitrided. In either case, a collimator used in either a NM or a NNM mode eventually becomes covered with deposits of Ti and TiN material which tend to flake off the collimator, resulting in contamination of the underlying IC substrate.

Accordingly, it has been recognized that conventional PVD sputtering techniques are inefficient and, in some instances, incapable of providing required directionality to thin films when fabricating VLSI and ULSI circuits. In accordance with standard PVD sputtering devices and techniques, the plasma created lacks a sufficient amount of ionized target material atoms, referred to as plasma intensity. The more intense the plasma, the greater the ability to steer and focus the plasma and thus impart an adequate amount of directionality to the ions in the plasma. The application of RF power to a band of material of the sputtered species, that is the same as the target, was introduced to improve the ability of a sputter source to fill grooves and vias. In so doing, the RF power couples into the neutral plasma and increases the ionization of the neutral atoms. However, the disadvantages with this method is that the band also gets sputtered, and becomes a consumable. Additionally, the sputtering of the band can increase the amount of particles created.

The use of magnetic fields in magnetron sputtering devices has also been introduced in the art to overcome the limitations of conventional PVD sputtering. The magnetic field serves to attract an electron-rich portion of the plasma in the vicinity of the target, whereby the electrons trapped about the target allow for an increase in the collisions between neutral atoms ejected from the surface of the target and the rapidly moving electrons. By increasing the quantity of collisions, the likelihood increases that a neutral ejected target atom will be struck by a sufficiently energetic particle within the plasma, thus causing the ejected target atom to lose one or more electrons and result in an ionized atom. By increasing the quantity of ionized target atoms within the plasma, the plasma density increases and so does the probability that further ionization of ejected target atoms will occur. However, conventional magnetron and rf-iPVD sputtering techniques are limited in their efficiency as the vast majority of metal atoms ejected from the target remain neutral, i.e., upwards of 98% or greater of the target material atoms remain un-ionized as they travel through the sputter chamber to the substrate. As with other PVD techniques, Ti-atoms are ejected from the surface of the sputter target at a random angle and the mean-free path of travel between the target cathode and the substrate for these neutral metal atoms is reduced by random collisions with other target atoms or inert gas ions. When the predominantly neutral atoms in these plasmas do come in contact with the substrate, they characteristically do so over a wide range of angles, generally conforming to a cosine distribution. In particular, when atoms are deposited on substrate surfaces at angles less than normal, it poses significant difficulty in uniformly filling trenches and interconnect vias. Accordingly, the overall efficiency of such systems are very low as most of the sputtered material remains unionized.

A technique that improves directionality of the depositing species and therefore improves the step coverage is ionized PVD (IPVD). IPVD techniques typically allow for thinner Ti/TiN film thicknesses due to improved bottom and sidewall coverage, which in turn, allows for less over-polish time and therefore less dishing and scratching during the CMP process of a W layer thereover the Ti/TiN films. Several techniques have been employed to achieve IPVD such as Radio Frequency biased IPVD (RFIPVD), Ion Metal Plasma (IMP), and Hollow Cathode Magnetron (HCM) can be named. However, many of the IPVD sources suffer from the fact that they cannot produce a sufficiently high density plasma that can adequately ionize the depositing metal species. The RFIPVD and IMP IPVD sources produce medium plasma densities in the order $1-5 \times 10^{11}$ particles/$cm^3$. This tends to limit the application of medium density plasma IPVD sources (RFIPVD and IMP) for certain applications including that of Ti and TiN liner and barrier layers in semiconductor processing. Additionally, as the successful management of the thermal budget is critical to a successful implementation of I-PVD, I-PVD for Ti and TiN has not been successfully introduced into semiconductor production due to the temperature control needed for the wafer during ionized deposition. The thermal budget is a measure of the time that the substrate spends at a higher temperature, as well as the continuous period of time that the substrate is at an elevated temperature. Including the instant cooling steps allows the substrate temperature to decrease, and thus interrupts activity related to thermal budget, such as, grain structure orientation and growth, diffusion of impurities, and the like. The cooling step of the instant invention also prevents the continued growth of grains for each of the Ti layer and the TiN layer. Further, in accordance with the invention, cooling the substrate prior to depositing the Ti layer and the TiN layer also minimizes the out-gassing of impurities from the surface of the substrate which leads to a clean interface between the aluminum line and the Ti layer, as well as a clean interface between the Ti layer and the TiN layer.

As the critical dimension of semiconductor devices continue to become smaller, the patterned contact or via holes get narrower and deeper, i.e. the aspect ratio of the contacts or vias increase. As such, Ti/TiN liner and barrier depositions for low contact resistance tungsten interconnects continues to be a major challenge for current and future aspect ratios of interconnect vias. Standard PVD techniques are proven to be inadequate for depositing films in narrow, high aspect ratio structures with necessary and sufficient step coverage as well as the necessary and sufficient via and contact resistance. Accordingly, a need continues to exist in the art for improved methods of depositing Ti liner layers and TiN barrier layers for high aspect ratio of contacts or vias having sufficient via and contact resistance.

Bearing in mind the problems and deficiencies of the prior art, it is therefore an object of the present invention to provide a method of depositing robust Ti liner layers and TiN barrier layers having improved via and contact resistance.

Another object of the present invention is to provide a method of depositing Ti liner layers and TiN barrier layers having reduced grain boundaries so that barrier liner performance is not compromised.

It is another object of the present invention to provide a method of depositing conformal Ti/TiN barrier layers within a high aspect ratio opening on a semiconductor wafer such that a metal layer does not diffuse past the barrier layer.

A further object of the invention is to provide a method of depositing Ti/TiN liner and barrier layers within a single deposition chamber, without the use of a collimator or shutter.

It is yet another object of the present invention to provide a method of depositing Ti/TiN liner and barrier layers having decreased processing steps, time and at reduced costs.

Still another object of the present invention is to provide a method of depositing Ti/TiN liner and barrier layers which imparts increased directionality to the atoms reaching the substrate surface.

Another object of the invention is to provide a method of depositing Ti/TiN liner and barrier layers having improved step coverage, grain size, grain orientation and roughness.

Still other objects and advantages of the invention will in part be obvious and will in part be apparent from the specification.

SUMMARY OF THE INVENTION

The above and other objects, which will be apparent to those skilled in art, are achieved in the present invention which is directed to, in a first aspect, a method of forming a Ti layer and a TiN layer on an integrated circuit substrate in a single PVD deposition chamber without using either a collimator or a shutter. The method includes the steps of providing a hollow cathode target containing titanium whereby the hollow cathode target has a cavity region and providing a substrate attached to an electrostatic chuck within the hollow cathode target. A layer containing Ti is formed on the substrate by sputtering Ti from the target and then a layer containing TiN is formed on the substrate by sputtering Ti from the target while simultaneously flowing a nitrogen-containing gas into the deposition chamber.

In accordance with the first aspect of the invention, the temperature of the substrate is controlled prior to deposition of at least one of the layer containing Ti on said substrate or the layer containing TiN on said substrate. In so doing, the temperature of the substrate may be controlled by applying a temperature controlled electrostatic chuck, or alternatively, by cooling the substrate by time delay.

In a second aspect, the invention relates to a method of forming a Ti layer and a TiN layer on an integrated circuit substrate in a single PVD deposition chamber without using either a collimator or a shutter. The method includes the steps of providing a hollow cathode target containing titanium whereby the hollow cathode target has a cavity region and providing a substrate attached to an electrostatic chuck within the hollow cathode target. The temperature of the substrate is controlled prior to depositing the layer containing Ti on the substrate, and then Ti is sputtered from a target to form such layer containing Ti. The temperature of the substrate is also controlled prior to depositing the layer containing TiN on the substrate. The layer containing TiN is then formed on the substrate by sputtering Ti from the target while simultaneously flowing a nitrogen-containing gas into the deposition chamber.

In accordance with the invention, the temperature of the substrate may be controlled prior to depositing both the Ti layer and the TiN layer by applying a temperature controlled electrostatic chuck, or alternatively, by cooling the substrate by time delay. Wherein the substrate is cooled by time delay, the substrate is allowed to cool for a range from about 20 seconds to about 120 seconds for both the Ti and the TiN layers.

The invention is characterized in that the single deposition chamber does not contain either a collimator or a shutter. The semiconductor wafer may have at least one via formed thereon. The instant method of forming the Ti and TiN layers on an integrated circuit substrate in a single PVD deposition chamber without using either a collimator or a shutter may further include creating a magnetic field having a magnetic null region located between the cavity region and the substrate, heating the substrate to a temperature in a range from about 25° C. to 350° C., and applying a negative volt in a range from about −400 to about −500 volts to the hollow cathode target. The method may still further include applying an amount of power in a range from about 20 to about 36 kilowatts to the hollow cathode target and applying a current not exceeding 1.0 amps to an electromagnetic coil.

Preferably, the hollow cathode target and the substrate are separated by a source-to-substrate spacing from about 86 mm to about 106 mm. Still further, the source-to-substrate spacing may be the same during the depositions of the layer containing Ti on the substrate and the layer containing TiN on the substrate. Alternatively, the source-to-substrate spacing may differ during the depositions of the layer containing Ti on the substrate and the layer containing TiN on the substrate. In the invention, the deposited Ti layer may have a thickness in a range from about 10 nm to about 70 nm, while the deposited TiN layer has a thickness in a range from about 10 nm to about 100 nm.

In still a further aspect of the invention, the invention relates to a method of forming a Ti layer and a TiN layer on an integrated circuit substrate in a single PVD deposition chamber without using either a collimator or a shutter. The method includes the steps of providing a hollow cathode target containing titanium whereby the hollow cathode target has a cavity region and providing a substrate attached to an electrostatic chuck within the hollow cathode target. The temperature of the substrate is controlled prior to depositing the layer containing Ti on the substrate by applying a temperature controlled electrostatic chuck to said substrate in addition to cooling said substrate by time delay. The Ti layer is then sputtered from a target to form such layer containing Ti. The temperature of the substrate is also controlled prior to depositing the layer containing TiN on the substrate by applying a temperature controlled electrostatic chuck to said substrate in addition to cooling said substrate by time delay. The layer containing TiN is then formed on the substrate by sputtering Ti from the target while simultaneously flowing a nitrogen-containing gas into the deposition chamber.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 7 shows a process flow in accordance with the invention.

DESCRIPTION OF THE PREFERRED EMBODIMENT(S)

In describing the preferred embodiment of the present invention, reference will be made herein to FIGS. 1–6 of the drawings in which like numerals refer to like features of the invention.

The present invention provides the use of incorporating a cooling step in the depositions processes of a titanium (Ti) liner film and a titanium nitride (TiN) barrier film in the same chamber to modulate and improve the via and contact resistance, without the use of a collimator or a shutter, using a hollow-cathode magnetron ("HCM"). In accordance with the invention, a temperature controlled ESC is integrated into a deposition process of Ti and TiN layers in a single chamber using an HCM, without the use of a collimator or a shutter, to modulate the temperature of the wafer for the process flow of such I-PVD Ti/TiN deposition in a cluster tool for semiconductor manufacturing applications.

In the preferred embodiment, the instant invention adds additional layers of functionality to the PVD deposition of Ti and TiN layers in the same chamber without the use of a collimator or a shutter as disclosed in U.S. patent application Ser. No. 09/524,987 (U.S. Pat. No. 6,342,133), filed Mar. 14, 2000, and assigned to the same assignee as the present application, the disclosure of which is incorporated herein by reference in its entirety. However, as will be recognized by one skilled in the art, the instant invention may be used with a variety of liner and barrier non-collimation and non-shutter deposition techniques used in the art.

Figure 1:
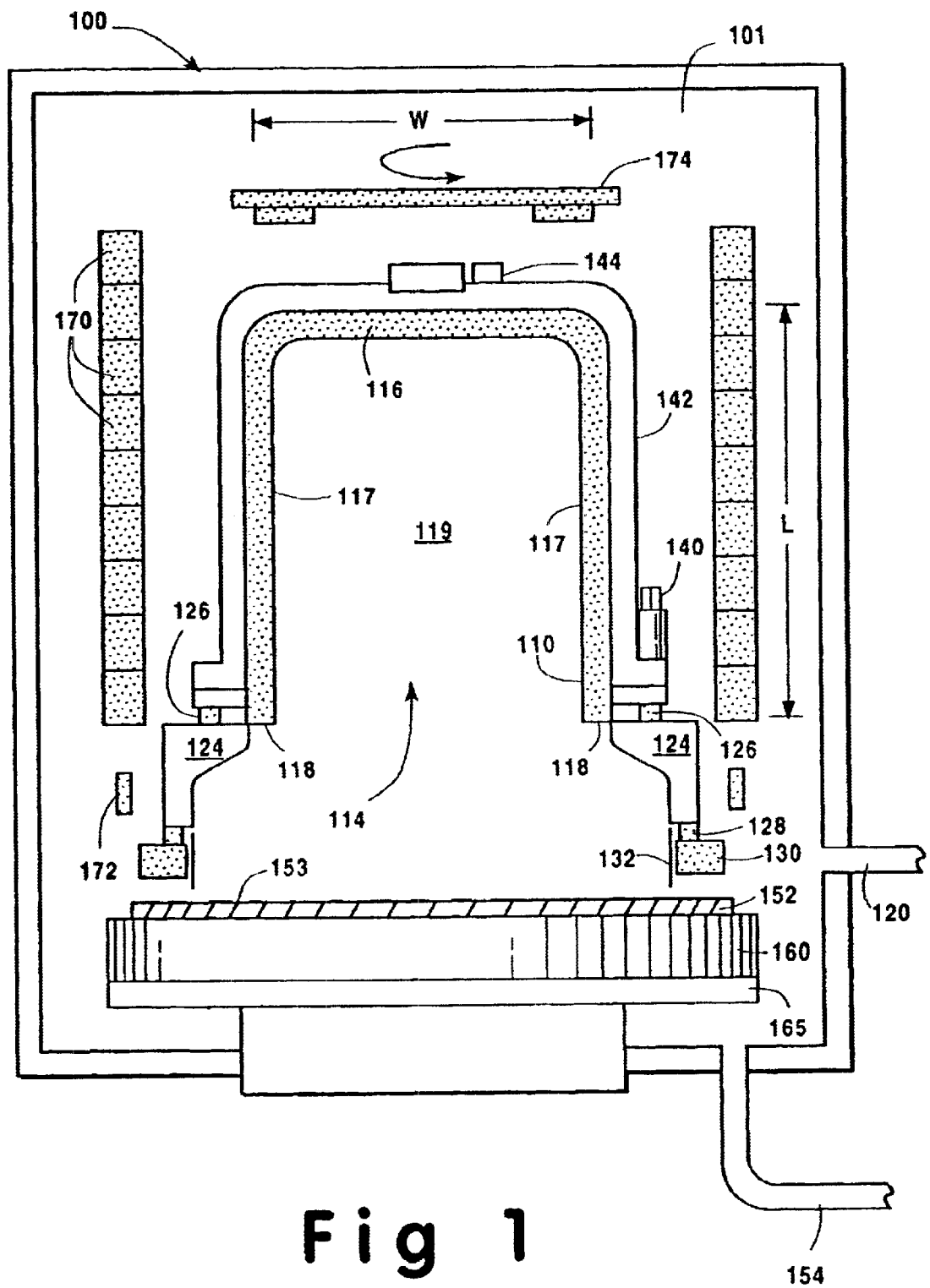
FIG. 1 is a schematic cross-sectional view of a portion of a high-intensity magnetron sputter apparatus having a hollow-cathode magnetron ("HCM") useful in practicing the present invention.

FIG. 1 is a schematic cross-sectional view of a portion of high-intensity magnetron sputter apparatus 100 having a hollow-cathode magnetron (herein after referred to as "HCM") assembly 101, of a type which is useful in practicing the present invention.

As illustrated in FIG. 1, HCM assembly 101 includes a hollow target cathode 110 having a hollow cavity region 114 comprising a planar bottom 116 of diameter W, a cylindrical wall 117 of height L from planar bottom 116 to cylindrical end 118, and an opening 119. Width W is preferably less than 2.5 cm and less than L. The hollow target cathode 110 serves as the sputter target for depositing Ti and TiN in NNM and is, therefore, made of titanium. Inert gas inlet 120 is located below the HCM, in the region located adjacent to adapter ring 130 to allow introduction of an inert gas, such as argon, which is used to form a plasma. The plasma formed in HCM sputter apparatus 100 is concentrated within the hollow cavity region 114 of hollow target cathode 110 and, as such, sputtering occurs from within cavity region 114. A floating anode ring 124 is used to create a potential difference with respect to hollow target cathode 110, which may be held at several hundred volts negative, such as, between −400 V and −500 V. The cylindrical ceramic insulator 126 electrically isolates anode 124 from hollow target cathode 110.

HCM assembly 101 also includes adapter ring 130, grounded anode shield 132, and ceramic insulator 128. Anode shield 132 is positioned between the HCM assembly 101 and the substrate surface 153 whereby it functions as a sputtering shield. The anode shield 132 collects errant Ti atoms that are not deposited on substrate surface 1 53. In so doing, it prevents any errant Ti atoms from depositing on other components of the HCM sputtering apparatus. As such, the anode shield 132 prevents any of such damaging deposits to flake off and enter into the Ti/TiN stack being deposited, and prevents the threat of damaging more costly components of the sputtering apparatus. The HCM assembly 101 further includes a water cooling inlet 140, water cooling outlet 144 and water cooling jacket 142 which prevents overheating of the hollow target cathode 110. During NNM operation, nitrogen-containing gas, typically $N_2$ gas, enters the deposition chamber, but outside of cavity region 114. Nitrogen gas inlet 154 is typically located away from hollow target cathode 110 to prevent nitrogen from reaching the titanium target.

Advantageously, HCM assembly 101 includes an electrostatic chuck ("ESC") 160 substrate holder to which integrated circuit substrate 152 is attached. The electrostatic chuck 160 provides an electrostatic charge clamping the integrated circuit substrate 152 to the chuck without mechanical fasteners. In so doing, the electrostatic chuck allows more surface area of the integrated circuit substrate 152 to be coated with the Ti and TiN layers in comparison to those substrate holder systems which use clamping devices to clamp a portion of the surface of the substrate for securing the substrate to a pedestal. Attached to electrostatic chuck 160 substrate holder is a pedestal heater 165 for heating the integrated circuit substrate 152. Preferably, the electrostatic chuck 160 is of the tripolar type, having two embedded electrically isolated electrodes for the application of a chucking voltage to hold the substrate, while optionally an RF bias may be applied to the chuck body by way of the electrostatic chuck electrodes. Optionally, the electrostatic chuck 160 may be connected to an adjustable RF bias power supply through a matching unit (not shown) whereby the RF bias power supply is coupled to the electrostatic chuck through to the embedded electrodes and thus to the wafer.

Figure 2:
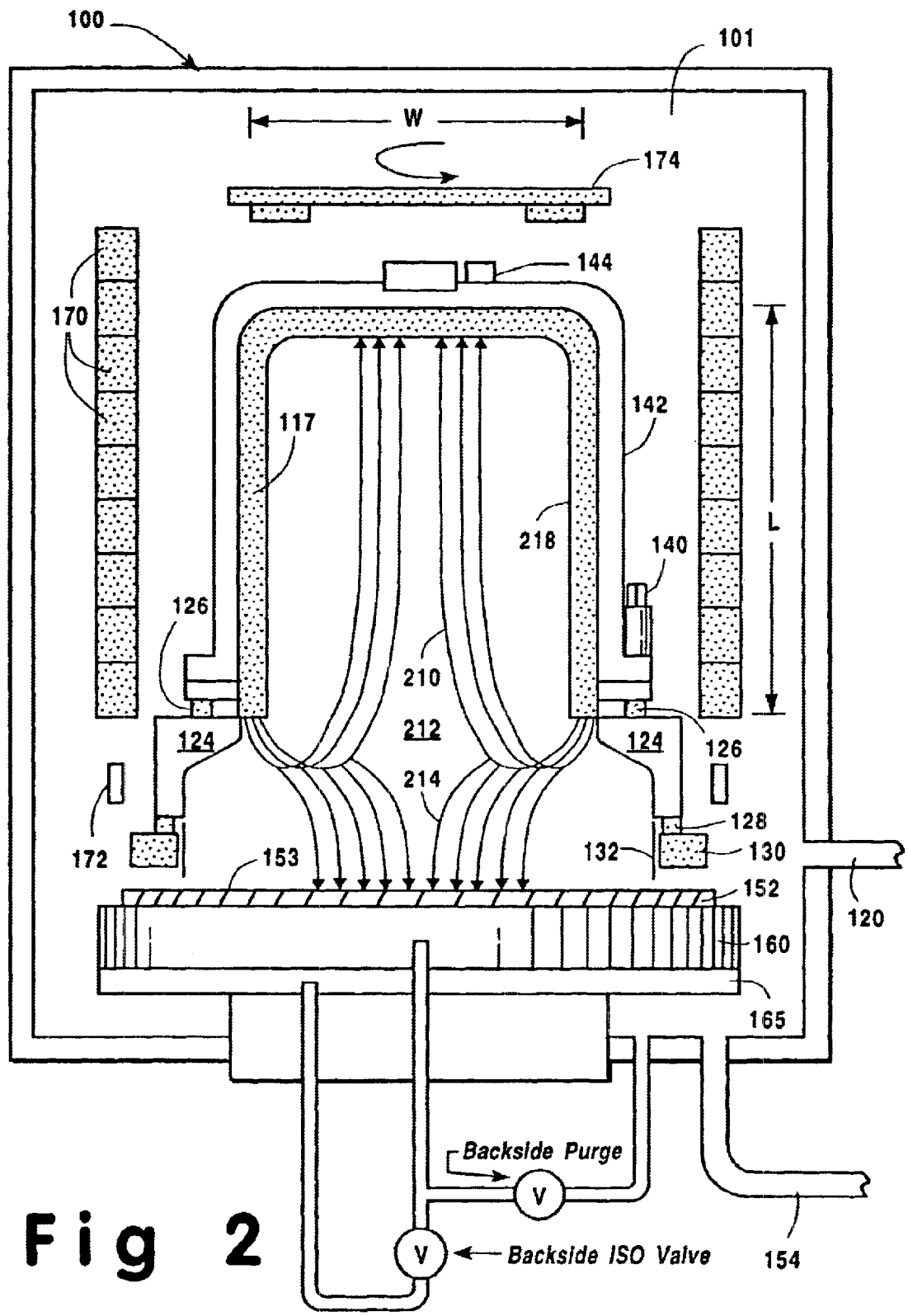
FIG. 2 is a schematic cross-sectional view of FIG. 1 showing ions and electrons leaving the HCM and traveling to the substrate surface for deposition thereto.

As shown in FIG. 2, back side gas can also be provided through a central hole in the electrostatic chuck 160, and a thermocouple may be mounted to the rear of the chuck. The backside isolation valve (iso valve) and backside purge valve can be used to accurately control the pressure between the IC substrate and the ESC. This pressure control is critical to having effective temperature control of the IC substrate. Prior art discloses the use of a mechanical clamp that presses the outer edges of the wafer against the pedestal, leading to poor control of the pressure and physical contact of the ring with the IC substrate. Such physical contact causes the outer edge of the wafer to be useless, as well as leads to the formation of particles due to the contact between the IC substrate and the mechanical ring. The instant invention overcomes such problems by providing the use of the backside isolation valve (iso valve) and backside purge valve to accurately control the pressure between the IC substrate and the ESC.

As depicted in FIG. 2, HCM assembly 101 further includes stacked annular magnets 170, electromagnetic coil 172, and rotating magnet 174. Stacked annular magnets 170, preferably permanent magnets, create a magnetic field, preferably a permanent magnetic field, having field lines 210 that loop through the side walls 117 and loop around inside of the hollow target cathode 110 so that the magnetic field lines are parallel to the surfaces 218 of walls 117 trapping electrons and ions in the plasma in the vicinity of the hollow target cathode walls 117. Magnets 170 are modified by electromagnetic coil 172 during a deposition method in accordance with the invention in order to improve magnetic field lines 210 and a magnetic null region 212.

The magnetic null-field region 212 is formed immediately outside opening 119 by stacked annular magnets 170. The magnetic null region 212 traps and retains ions and electrons inside the hollow target cathode except for those particles which have entered into the null region 212 at the upper edge 214 of the region 212 with axial velocity and very little radial velocity. The term "axis" herein refers to the axis located at the center of cylindrical hollow target cathode 110, and which is normal to the plane of substrate 152 in FIG. 1, while the term "axial" and related terms herein refer to the direction of the center axis of hollow target cathode towards substrate 152. Ions and electrons which have primarily axial velocity are able to leave the hollow target cathode along the axis at upper edge 214 of null region 212 in FIG. 2 and travel to substrate surface 153 for deposition thereto. Other particles are reflected back and retained in the hollow target cathode.

The HCM assembly 101 is designed to be operated within a vacuum deposition chamber, not shown. The vacuum deposition chamber is evacuated to a sufficiently low pressure, such as, $10^{-5}$ torr or less, and then a small quantity of an inert gas, such as argon, is introduced into the vacuum chamber raising the pressure in the chamber to 1–5 millitorr, for example. In the preferred embodiment, argon is introduced directly into the cathode cavity region 114 via inlet 120 so that it is present in greatest concentration where the plasma discharge is to be initiated, thereby making it is possible to lower the overall system operating pressure. A plasma discharge is then created by applying a high negative voltage on hollow target cathode 110, whereby the plasma is concentrated by the magnetic field lines 210 primarily into an area adjacent to surface 218 of target cathode 110. Gas ions are formed in the plasma and strike the surface of the sputter target cathode, causing neutral Ti-atoms to be ejected from the surface of the target. As the magnetic field moves outward toward opening 119 of cavity region 114, the magnetic field gradually declines until it reaches a point where the magnetic field has completely dissipated; that is, the magnetic null. The magnetic null exists outside of the hollow cavity region 114 of the target cathode 110, a short distance from opening 119 in hollow cathode target 110. It is at this magnetic null region where the plasma that exists in the hollow cathode target is separated from the plasma beam which flows toward the substrate surface 153. Beyond the distance where the magnetic null exists, a remnant reversing magnetic field, $B_{rev}$, exists which typically reaches a maximum of about 50 gauss a short distance from the magnetic null, and then decays asymptotically towards zero as it approaches the surface. If this remnant reversing magnetic field is not counteracted, a small, but potentially damaging, magnetic field may contact the substrate and threaten charging damage.

Electromagnetic coil 172 provides for counteracting the remnant reversing magnetic field and, hence, is useful for the deposition of the Ti and TiN ions. In so doing, the electromagnetic coil 172 is connected to a power supply (not shown in FIG. 1) and is positioned outside the instant HCM deposition chamber at a distance just beyond the magnetic null region so that the opposing or bucking magnetic field that electromagnetic coil 172 generates interacts almost exclusively with the remnant reversing magnetic field. In accordance with the invention, by varying the electrical current supplied to the electromagnetic coil 172, the strength of the magnetic field generated by the coil can be increased or decreased accordingly and, as such, can harness the remnant reversing magnetic field. For example, the coil current can be tuned to almost fully negate the remnant reversing magnetic field, thus allowing a large, almost magnetic-field-free region to exist beyond the magnetic null which, in effect, expands the magnetic null region to allow the plasma beam to diffuse freely in the field free region and achieve superior ion uniformity throughout the diffused plasma beam.

Accordingly, the use of a current variable electromagnetic coil is useful when optimization of plasma uniformity is essential, particularly because it allows instantaneously adjusting the spread of the plasma beam, and thus the ion uniformity, while forming the Ti/TiN stack to impart improved step coverage and improved formation of high quality layers of Ti and TiN in comparison to prior art methods and apparatus, such as those which deposit neutral atoms onto the substrate surface. Additionally, by greatly reducing the strength of the remnant magnetic field, the use of a current variable electromagnetic coil lessens the likelihood that the devices on the substrate will be subjected to charging damage. In accordance with the invention, the use of a current variable electromagnetic coil is particularly useful for the deposition of Ti and TiN layers because it allows instantaneously adjusting the spread of the plasma beam, and thus the ion uniformity, while forming the Ti/TiN stack thereby providing the ability to impart improved step coverage and improved formation of high quality layers of Ti and TiN in comparison to prior art methods and apparatus such as those which deposit neutral atoms onto the substrate surface.

The instant high intensity plasma developed in the HCM, which typically has a density of $10^{13}$ particles/cc, is sufficiently intense to cause ionization of not only the gas atoms, but also of a large number of the sputtered Ti-atoms. The high intensity of the present invention is created in part by the ability of the HCM to increase the Ti-ion count well beyond previous magnetron sputtering devices used for Ti/TiN deposition. The sputtering developed in the HCM is predominantly of Ti-ions, rather than neutral particles, and these ionized particles are far more inclined to being steered and/or focused to the substrate surface.

Accordingly, by imparting directionality to the Ti-ions in the plasma by the sputtering developed in the HCM an overall improvement in sputtering operations is seen in the ability to impart the proper step coverage and trench-filling in high AR vias and trenches, as opposed to the random impingement of prior art sputtering mechanisms dominated by neutral particles. While Ti-ions deposited in accordance with the invention are much more energetic than neutral atoms deposited using prior art sputtering techniques, they are not so energetic as to cause damage to the substrate. Particularly, ions having an energy of less than approximately 100 ev do not cause damage to the wafer substrate. This damage-causing level is well above the energy of the ions deposited using the present invention.

Advantageously, the instant invention provides the additional step(s) of controlling the deposition temperatures during the Ti/TiN depositions in the non-nitrided (metallic) mode in the same chamber, without the use of either a collimator or shutters, to provide improved low contact resistance for landed and nonlanded vias compared to prior art techniques. Previous techniques have not looked at providing a time delay between or after the depositions of either the Ti and TiN layers as a means of reducing the via and contact resistance. In accordance with the invention, the temperature control is obtained using an electrostatic chuck to conduct the heat away from the wafer, in addition to cooling the wafer during the Ti/TiN depositions by time delay. Accordingly, it has unexpectedly been found that incorporating a cooling step between the deposition of Ti and TiN layers advantageously modulates, i.e., lowers, the via and contact resistance.

Figure 3:
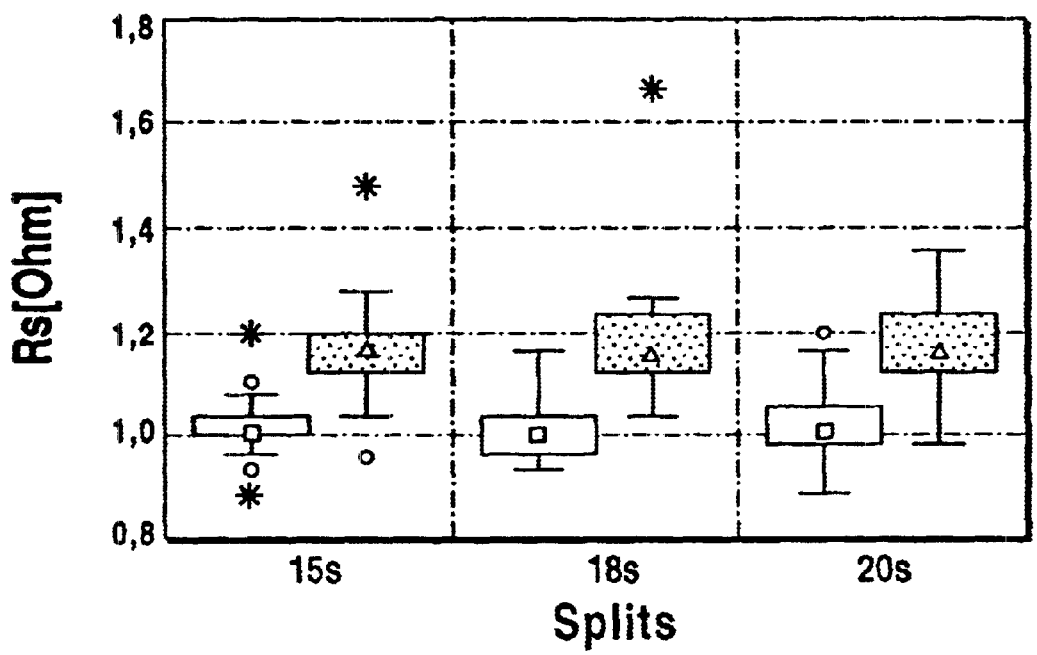
FIG. 3 shows a graph of a single via resistance for landed and unlanded single vias depending on the degas time.

In accordance with the invention, FIG. 3 shows a single via resistance for landed (left box) and unlanded (right box) single vias depending on the degas time. The degas step is the step that the IC substrate goes through before it enters the HCM chamber where the Ti and TiN are deposited. As depicted, FIG. 3 illustrates the varying degas times prior to depositing the Ti/TiN layers. In FIG. 3, the substrate 152 is in the degas chamber before coming into the HCM chamber where the ESC 160 is present. FIG. 3 shows that increasing the degas time does not have any effect on the via resistance (Rs) as measured for the three different degas conditions.

Figure 4:
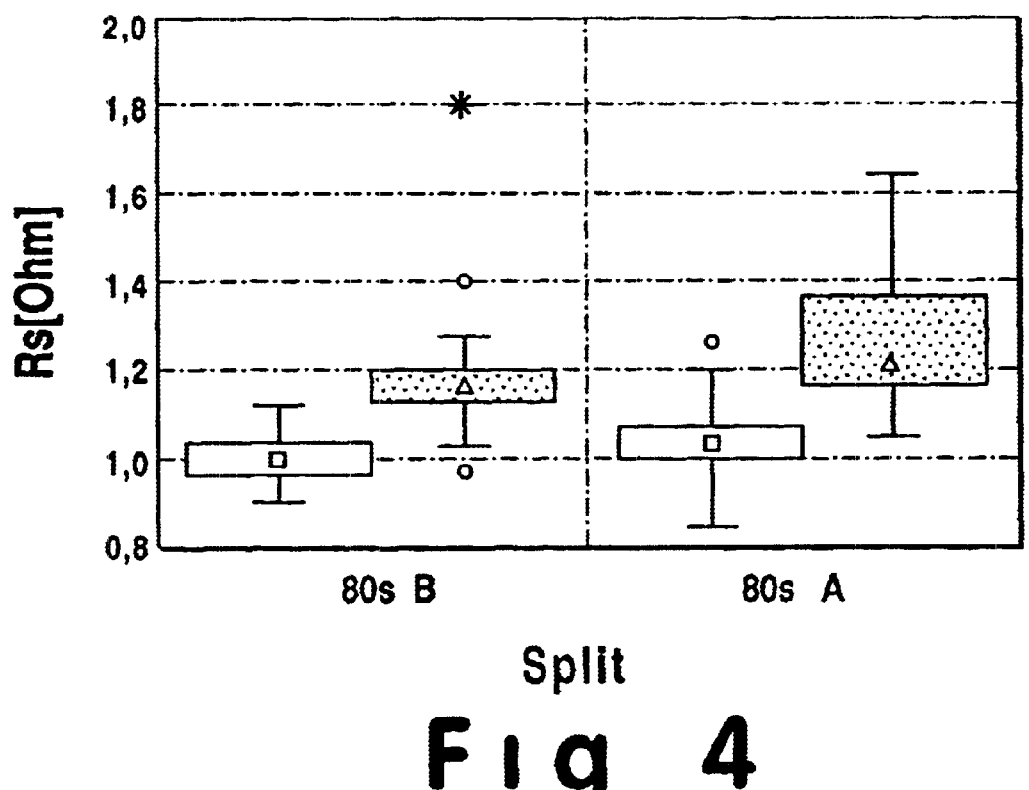
FIG. 4 shows a graph of a single via resistance for landed and unlanded vias depending on 80 s wait step prior to Ti and prior to TiN deposition.

FIG. 4 shows a single via resistance for landed and unlanded vias depending on 80 second ("s") wait step prior to Ti (case A) and prior to TiN (case B) depositions for the case where the wafer only rests on a pedestal, i.e., there is no ESC. Accordingly, clamping is not applied to the wafer in FIG. 4. Unlike FIG. 3, the substrate 152 in FIG. 4 is sitting on a pedestal (instead of ESC 160) and is heated for 80 s before the depositions of the Ti layer (case 80 s A) or the TiN layer (case 80 s B). As illustrated, there is no difference in the delays before the deposition of either the Ti layer (case 80 s A) and the TiN layer (case 80 s B), as well as no difference in comparison to FIG. 3. Accordingly, this indicates that just heating the wafer, or allowing it to sit idle on a pedestal, does not modulate, i.e., lower, the contact and via resistance, which is typical of the performance observed in the prior art where there is no active temperature control, unlike that of the instant invention where active temperature control is provided by ESC 160 and time delay.

Figure 5:
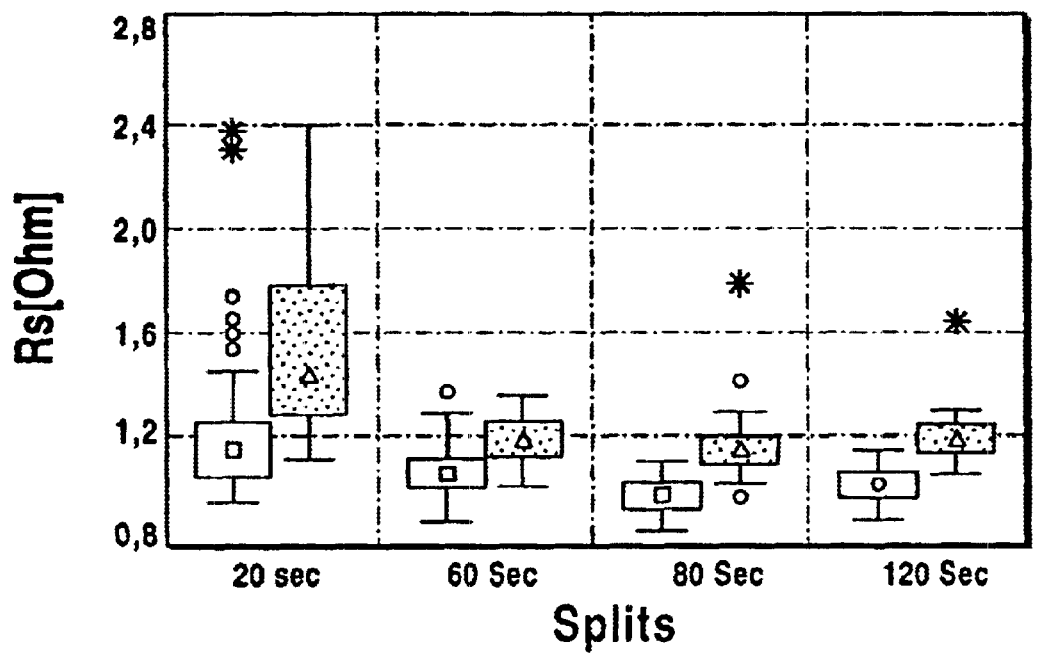
FIG. 5 shows a graph of a single via resistance for landed and unlanded single vias depending on the wait step time prior to TiN deposition.

FIG. 5 depicts the wait step time prior to TiN deposition. As shown, the ideal time delay prior to depositing the TiN layer is between 20 seconds and 60 seconds. As illustrated, it is clearly demonstrated that when the IC substrate is allowed to cool for a short period of time, the via resistance (Rs) decreases significantly, especially in the case of unlanded vias (dark, shaded box).

Figure 6:
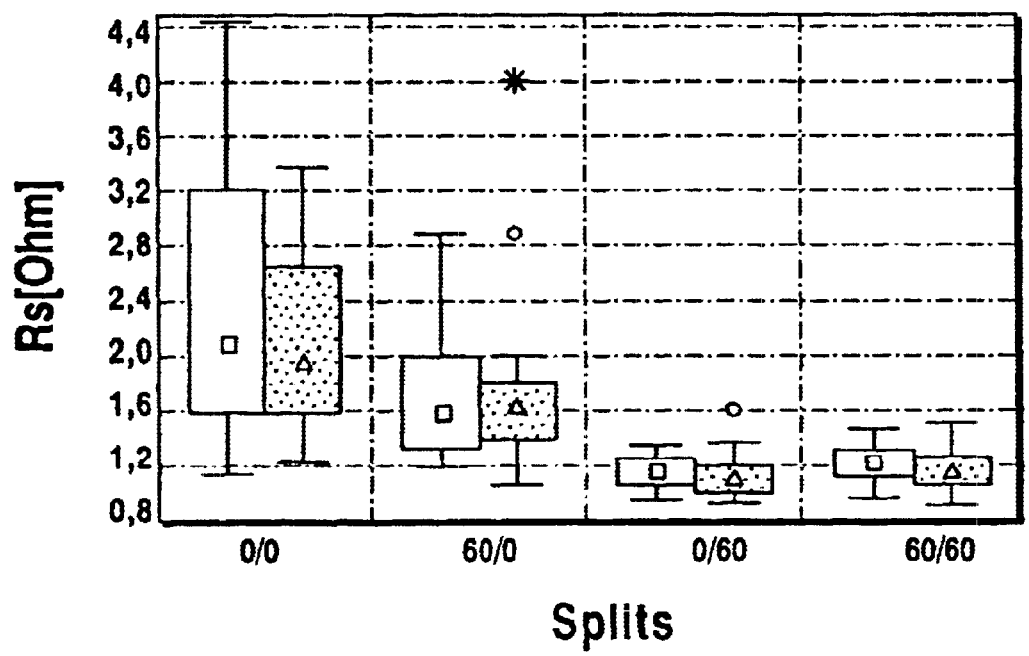
FIG. 6 shows a graph of a single via resistance for landed and unlanded single vias depending on cooling times prior to Ti and TiN deposition at set point 200° C. in accordance with the instant invention.

FIG. 6 shows a single via resistance for landed and unlanded single vias depending on cooling times prior to the Ti layer deposition and prior to the TiN layer deposition of an ESC at set point 200° C. The legend 0/0 on the x-axis indicates a 0 second delay before the Ti deposition and a 0 second delay before the TiN deposition. FIG. 6 shows that cooling the wafer immediately before the deposition of the Ti and TiN layers is not effective. In accordance with the invention, and as shown in FIG. 6, it has unexpectedly been found that there are optimal cooling time delays required prior depositing the Ti layer and prior depositing the TiN layer to successfully reduce the contact and via resistance of such deposited Ti and TiN layers.

In accordance with the invention, the additional step of integrating cooling steps prior to depositing the Ti/TiN layers affects the interfaces between the Ti layer and the underlying metal layer, the TiN layer and the underlying Ti layer, and the interface between a W layer and the underlying TiN layer. In so doing, the instant invention advantageously improves the thermal budget and crystal structure, and decreases the amount of impurities at the above interfaces.

In the invention for depositing Ti and TiN on an integrated circuit substrate, the Ti liner layer is sputtered and deposited in a non-nitrided mode ("NNM"). In so doing, a hollow cathode target having a cavity region and containing titanium is provided and titanium from the target is sputtered to form a layer containing Ti on the substrate. In depositing the Ti layer, an amount of power in a range of from 20 to 36 kilowatts may be applied to the target, thereby creating a negative voltage in a range of from −350 to −500 volts at the hollow cathode target while simultaneously applying a current not exceeding 1.0 amps to an electromagnetic coil to modify the magnetic field. Subsequently, the TiN layer, Ti is sputtered from the target and simultaneously a nitrogen-containing gas is flowed into the single deposition chamber to form a layer containing TiN on the substrate over the Ti layer of the invention. During the depositions of both the Ti and TiN layers in accordance with the invention, the substrate may be heated to a temperature in a range of from 25° C. to 350° C. Additionally, both the Ti and TiN layers may be deposited on the substrate with different source to substrate distances, i.e., the substrate can be moved to different positions for the Ti and TiN depositions, or alternatively, at a fixed source to substrate distances.

In certain embodiments of the invention, the hollow target cathode and the substrate may be separated by a distance ranging from about 86 mm to about 106 mm. This distance is measured from 100 mm below the edge of HCM 118 to the substrate 152. A method in accordance with the invention may be used to deposit layers of Ti and TiN having thicknesses up to several microns, the final thickness being limited by the amount of Ti target material. In typical integrated circuit fabrication, however, the thickness of a Ti layer formed is typically in a range of from 10 to 70 nm, and the thickness of a TiN layer formed is typically in a range of from 10 to 100 nm.

FIG. 7 shows a process flow sheet of a generalized method in accordance with the invention for forming a Ti layer and a TiN layer by integrating cooling step(s) in the deposition process in the same deposition chamber using the same Ti target in a NNM, without use of either a collimator or a shutter, to modulate the contact and via resistance. The method of flowsheet 700 is described here with reference to FIGS. 1 and 2, although it is understood that methods in accordance with the invention may be applied to a large variety of structures using a variety of HCM assemblies without departing from the inventive concepts. Also, the order of some of the process steps as outlined in FIG. 7 may be changed.

In step 710 of generalized method 700, the deposition chamber is evacuated down to a sufficiently low pressure, for example, $10^{-5}$ torr or less. In step 712, ESC 160 is heated to a "stage" temperature, typically in a range of from about 25° C. to about 350° C., preferably about 300° C. In step 714, the substrate wafer to be processed is placed on ESC 160 so that it is heated up to or near the stage temperature. The source-to-substrate spacing ("SSS"), that is, the distance between 100 mm from the end 118 of hollow target cathode 110 and substrate 152 is in a range from about 86 mm to about 106 mm, preferably about 106 for Ti and TiN. In step 716, a negative DC voltage, typically in a range of from −400 V to −500 V, is applied to hollow target cathode 110. The power applied to the HCM apparatus is typically in a range of from 20 to 36 kW, and preferably about 30 kW. In step 718, cooling water is flowed at sufficient temperature and flow-rate to maintain the temperature of the target cathode during the deposition process in a range of 65° C. to 95° C. In step 720, a DC current in a typical range of from 0.05 to 1.0 amps, preferably about 0.25 A, at about 80–120 volts is flowed through electromagnetic coil 172 to influence magnetic field lines 210 and magnetic null region 212, as described above.

In step 722, prior to depositing the Ti layer over the substrate, the substrate is cooled. That is, a temperature control step of the substrate is integrated into the processing steps. In so doing, the temperature control is achieved using an electrostatic chuck to conduct the heat away from the wafer, in addition to cooling the wafer prior to the deposition of the Ti layer by time delay. Preferably, for the deposition of the Ti layer, the electrostatic chuck is applied to conduct the heat away from the wafer and the wafer is allowed to cool for a range from about 20 seconds to about 120 seconds. The instant temperature control step of integrating the use of electrostatic chuck to conduct the heat away from the wafer, in addition to cooling the wafer prior to the deposition of the Ti layer by time delay is integrated in a single deposition chamber, in the non-nitrided (metallic) mode in the same chamber, without the use of either a collimator or shutters.

Next, in step 724, inert plasma-forming gas, such as argon, is introduced into the evacuated deposition chamber at a flow-rate in a range of from about 45 to 140 sccm, and preferably about 90 sccm, raising the pressure in the chamber from about 1 to about 5 millitorr, for example. The argon gas is introduced directly into cavity region 114 through inlet 120 so that it is present in greatest concentration where the plasma discharge is to be initiated. A plasma discharge is created as a result of the high negative voltage on hollow target cathode 110. The plasma is concentrated by the magnetic field lines 210 primarily into an area adjacent to a surface of target cathode 120. Gas ions are formed in the plasma and strike the surface of the sputter target cathode, causing neutral Ti-atoms to be ejected from the surface of the target. Neutral Ti-atoms are converted to Ti-ions through electron-removing collisions with other gas atoms in the plasma. Ti-ions having a velocity substantially normal to the plane of substrate 152 exit the cavity region 114 through magnetic null region 212 and impinge on substrate surface 153, forming a Ti layer as depicted by step 726. The deposition rate of the Ti layer is typically greater than 80 nm/min. As a result, deposition of a Ti liner layer 416 with a typical thickness of 25 nm in step 726 is completed in about 17 seconds.

After the Ti layer has been deposited the substrate is again cooled in step 728 prior to depositing the Ti layer, i.e., the step of temperature control of the substrate is integrated into the processing steps. Again, the temperature control is achieved using an electrostatic chuck to conduct the heat away from the wafer, in addition to cooling the wafer prior to the deposition of the TiN layer by time delay. Preferably, for the deposition of the TiN layer, the electrostatic chuck is applied to conduct the heat away from the wafer and the wafer is allowed to cool for a range from about 20 seconds to about 120 seconds. The temperature control step of integrating the use of electrostatic chuck to conduct the heat away from the wafer, in addition to cooling the wafer prior to the deposition of the Ti layer by time delay is integrated in the single deposition chamber, in the non-nitrided (metallic) mode in the same chamber, without the use of either a collimator or shutters.

The TiN layer may then be deposited thereover the cooled substrate. In step 730, the DC current flowed through electromagnetic coil 172 is preferably about 0.25 A at about 80–120 volts. To begin deposition of TiN, $N_2$ is flowed into the deposition chamber near the substrate through nitrogen gas inlet 154 at a flow-rate typically in a range of from about 24 sccm to about 36 sccm, preferably about 28 sccm. Inert gas flow into cavity region 114 is typically increased during TiN deposition from its value during Ti-deposition steps 722 and 724. When argon gas is used, its flow-rate is in a range of from 45 to 140 sccm, preferably about 135 sccm. In step 732, nitrogen atoms combine with Ti-ions at the substrate, forming a TiN layer. The deposition rate of the TiN layer is typically greater than 70 nm/min. As a result, deposition of a TiN barrier layer 418 with a typical thickness of 50 nm in step 732 is completed in about 43 seconds. During deposition step 732, the DC current flowed through electromagnetic coil 172 is preferably about 0.19 A at about 80–120 volts.

Additionally, in accordance with the invention, an RF bias may be applied to the wafer as disclosed in related U.S. patent application Ser. No. 10/060,724 (Attorney Docket No. NOVE100028000), filed the same day and assigned to the same assignee as the present application, the disclosure of which has been incorporated by reference. In so doing, the RF bias is applied to the wafer to resputter and re-deposit the deposited Ti and TiN layers within contact holes causing changes in physical properties of such layers including, for example, step coverage, grain size, grain orientation and roughness.

There has been described a novel method for depositing Ti and TiN layers on an integrated circuit substrate in the same PVD chamber using the same titanium target in NNM in combination with integrating a cooling step(s) into the process to modulate, or lower, the via and contact resistance, without use of either a shutter or a collimator. The instant invention successfully integrates a cooling step into the PVD deposition of Ti and TiN layers, in the same chamber, without the use of a collimator or a shutter, as disclosed in U.S. patent application Ser. No. 09/524,987 (U.S. Pat. No. 6,342,133), to allow deposition of the Ti and TiN layers either with or without an RF bias applied to ESC 160, and with or without the temperature control of the wafer. A method in accordance with the invention is particularly useful for filling vias and contact holes having high aspect ratios. The novel method uses a hollow-cathode magnetron technique. It should be understood that the particular embodiments shown in the drawings and described within this specification are for purposes of example and should not be construed to limit the invention, which will be described in the claims below. It is also evident that the steps recited may, in some instances, be performed in a different order; or equivalent structures and processes may be substituted for the structures and processes described. Consequently, the invention is to be construed as embracing each and every novel feature and novel combination of features present in and/or possessed by the fabrication methods and compositions described.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of forming a Ti layer and a TiN layer on an integrated circuit substrate in a single PVD deposition chamber without using either a collimator or a shutter, comprising the steps:
   (a) providing a hollow cathode target containing titanium, said hollow cathode target having a cavity region;
   (b) providing a substrate within said hollow cathode target, said substrate attached to an electrostatic chuck;
   (c) sputtering Ti from said target to form a layer containing Ti on said substrate;
   (d) sputtering Ti from said target and simultaneously flowing a nitrogen-containing gas into said deposition chamber to form a layer containing TiN on said substrate; and
   (e) controlling the temperature of said substrate prior to deposition of at least one of said layer containing Ti on said substrate of step (c) or said layer containing TiN on said substrate of step (d), wherein step (e) is performed by cooling the substrate by time delay.

2. The method of claim 1 wherein step (e) is performed by applying a temperature controlled electrostatic chuck.

3. A method of forming a Ti layer and a TiN layer on an integrated circuit substrate in a single PVD deposition chamber without using either a collimator or a shutter, comprising the steps:
   (a) providing a hollow cathode target containing titanium, said hollow cathode target having a cavity region;
   (b) providing a substrate within said hollow cathode target, said substrate attached to an electrostatic chuck;
   (c) controlling the temperature of said substrate prior to deposition a layer containing Ti on said substrate;
   (d) sputtering Ti from said target to form said layer containing Ti on said substrate;
   (e) controlling the temperature of said substrate prior to deposition a layer containing TiN on said substrate; and
   (f) sputtering Ti from said target and simultaneously flowing a nitrogen-containing gas into said deposition chamber to form said layer containing TiN on said substrates, wherein steps (c) and (e) are performed by cooling the substrate by time delay.

4. The method of claim 1 wherein steps (c) and (e) are performed by applying a temperature controlled electrostatic chuck to said substrate.

5. The method of claim 3 wherein for the deposition of the Ti layer, said substrate is allowed to cool for a range from about 20 seconds to about 120 seconds.

6. The method of claim 3 wherein for the deposition of the TiN layer, said substrate is allowed to cool for a range from about 20 seconds to about 120 seconds.

7. The method of claim 3 wherein step (b) comprises providing a semiconductor wafer having at least one via formed thereon.

8. The method of claim 3, characterized in that said single deposition chamber does not contain either a collimator or a shutter.

9. The method of claim 3, further comprising creating a magnetic field, said magnetic field having a magnetic null region located between said cavity region and said substrate.

10. The method of claim 3, further comprising heating said substrate to a temperature in a range from about 25° C. to 350° C.

11. The method of claim 3, further comprising applying a negative volt in a range from about −400 to about −500 volts to said hollow cathode target.

12. The method of claim 3, further comprising applying an amount of power in a range from about 20 to about 36 kilowatts to said hollow cathode target.

13. The method of claim 3, further comprising applying a current not exceeding 1.0 amps to an electromagnetic coil.

14. The method of claim 3, wherein said hollow cathode target and said substrate are separated by a source-to-substrate spacing from about 86 mm to about 106 mm.

15. The method of claim 14, wherein said source-to-substrate spacing is the same during the depositions of said layer containing Ti on said substrate and said layer containing TiN on said substrate.

16. The method of claim 14, wherein said source-to-substrate spacing differs during the depositions of said layer containing Ti on said substrate and said layer containing TiN on said substrate.

17. The method of claim 3, wherein said Ti layer has a thickness in a range from about 10 nm to about 70 nm, while said TiN layer has a thickness in a range from about 10 nm to about 100 nm.

18. A method of forming a Ti layer and a TiN layer on an integrated circuit substrate in a single PVD deposition chamber without using either a collimator or a shutter, comprising the steps:
   (a) providing a hollow cathode target containing titanium, said hollow cathode target having a cavity region;
   (b) providing a substrate within said hollow cathode target, said substrate attached to an electrostatic chuck;
   (c) controlling the temperature of said substrate prior to deposition a layer containing Ti on said substrate by applying a temperature controlled electrostatic chuck to said substrate in addition to cooling said substrate by time delay;
   (d) sputtering Ti from said target to form said layer containing Ti on said substrate;
   (e) controlling the temperature of said substrate prior to deposition a layer containing TiN on said substrate by applying a temperature controlled electrostatic chuck to said substrate in addition to cooling said substrate by time delay; and
   (f) sputtering Ti from said target and simultaneously flowing a nitrogen-containing gas into said deposition chamber to form said layer containing TiN on said substrate.

* * * * *